United States Patent
Taguwa (10) Patent No.: US 7,504,698 B2
(45) Date of Patent: *Mar. 17, 2009

(54) SEMICONDUCTOR DEVICE AND MANUFACTURING METHOD THEREOF

(75) Inventor: Tetsuya Taguwa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 114 days.

This patent is subject to a terminal disclaimer.

(21) Appl. No.: 11/471,680

(22) Filed: Jun. 21, 2006

(65) Prior Publication Data

US 2006/0284264 A1  Dec. 21, 2006

(30) Foreign Application Priority Data

Jun. 21, 2005  (JP) .............................. 2005-180427

(51) Int. Cl.
H01L 29/76  (2006.01)

(52) U.S. Cl. .................. 257/384; 257/249; 257/274

(58) Field of Classification Search ................ 257/249, 257/384, 274, 388, 338, 351

See application file for complete search history.

(56) References Cited

U.S. PATENT DOCUMENTS 4,389,257 A * 6/1983 Geipel et al. ................. 438/301

7,078,747 B2 * 7/2006 Taguwa ........................ 257/249

FOREIGN PATENT DOCUMENTS

| JP | 11-233451 A | 8/1999 |
| JP | 2003-163348 A | 6/2003 |
| JP | 2005-116693 A | 4/2005 |

* cited by examiner

Primary Examiner—Andy Huynh
Assistant Examiner—Thinh T Nguyen
(74) Attorney, Agent, or Firm—McDermott Will & Emery LLP (57) ABSTRACT

A semiconductor device and a manufacturing method thereof that can prevent mutual diffusion of impurity in a silicide layer and can decrease sheet resistance of an N-type polymetal gate electrode and a P-type polymetal gate electrode, respectively in the semiconductor device having gate electrodes of a polymetal gate structure and a dual gate structure are provided. The P-type polymetal gate electrode includes a P-type silicon layer containing P-type impurity, a silicide layer formed on the P-type silicon layer and having a plurality of silicide grains which are discontinuously disposed in a direction substantially parallel with the surface of the semiconductor substrate, a silicon film continuously formed on the surface of the P-type silicon layer exposed on the discontinuous part of the silicide layer and on the surface of the silicide layer, a second metal nitride layer formed on the silicon film, and a metal layer formed on the metal nitride layer.

12 Claims, 8 Drawing Sheets

SEMICONDUCTOR DEVICE AND MANUFACTURING METHOD THEREOF

TECHNICAL FIELD

The present invention relates to a semiconductor device and a manufacturing method thereof. Particularly, the invention relates to a semiconductor device having gate electrodes of a polymetal gate structure and a dual gate structure, and a manufacturing method of this semiconductor device.

BACKGROUND OF THE INVENTION

Recently, a polymetal gate structure of a semiconductor device, particularly, a DRAM (Dynamic Random Access memory) has been widely used, in order to improve the operation speed of the device.

The polymetal gate structure is a gate electrode structure having a metal layer laminated on a polysilicon layer. The polymetal gate structure is known to decrease resistance (sheet resistance) of a word line in a plane direction more than a polycide gate structure that is used conventionally. However, when a metal layer (for example, tungsten (W)) is directly formed on the polysilicon layer, the polysilicon layer reacts with the metal layer in a subsequent high-temperature thermal annealing, thereby forming a thick silicide layer (such as a tungsten silicide (WSi) layer) between the polysilicon layer and the metal layer. Since the silicide layer has relatively high electric resistance, formation of the silicide layer needs to be suppressed, in order for a high-speed the operation of the device. To solve this problem, Japanese Patent Application Laid-Open No. H11-233451 discloses a technique of suppressing reaction between the polysilicon layer and the metal layer, by forming a metal nitride layer such as tungsten nitride (WN) between the polysilicon layer and the metal layer.

However, when the metal nitride layer is directly formed on the polysilicon layer, the polysilicon layer reacts with the metal nitride layer in the subsequent thermal annealing, thereby forming a metal silicide nitride layer. The metal silicide nitride layer has high resistance, depending on composition or a structure of the laminated film. When the metal silicide nitride layer has a large film thickness, a low-resistance polymetal gate electrode cannot be obtained.

The inventor of the present invention proposes a method of suppressing the reaction between the polysilicon layer and the metal nitride layer, by inserting a thin silicide layer between the polysilicon layer and the metal nitride layer, in Japanese Patent Application Laid-Open No. 2003-163348.

On the other hand, in order to increase the performance of a device and to decrease the driving voltage of the device, a dual gate structure is also used. The dual gate structure uses a gate electrode containing N-type polysilicon, having N-type impurity (such as phosphorus) introduced in the gate electrode, for an N-channel transistor, and uses a gate electrode containing P-type polysilicon, having P-type impurity (such as boron) introduced in the gate electrode, for a P-channel transistor.

However, as described in Japanese Patent Application Laid-Open No. 2003-163348, when an electrode of a polymetal gate structure having a lamination of a polysilicon layer, a silicide layer, a metal nitride layer, and a metal layer is applied to the dual gate structure, the following problem occurs. Before gate patterning is performed, the N-type polysilicon layer and the P-type polysilicon layer form an adjacently-connected continuous film. A silicide layer is formed on an entire top surface of this film. Therefore, due to the thermal annealing and the like before the gate patterning, N-type impurity in the N-type polysilicon layer and P-type impurity in the P-type polysilicon layer are absorbed in the silicide layer, and are mutually diffused, thereby increasing the interface resistance and increasing a gate conversion film thickness. Therefore, the inventor of the present invention has proposed a method of preventing the mutual diffusion of impurities in the N-type and the P-type polysilicon layers via the silicide layer, by forming the silicide layer discontinuously on the P-type polysilicon layer.

However, it has become clear that when the silicide layer is formed discontinuously on the P-type polysilicon layer, sufficiently low sheet resistance cannot be obtained in the P-type polymetal gate electrode, in some cases.

SUMMARY OF THE INVENTION

The present invention has been achieved to solve the above problems. It is an object of the present invention to provide a semiconductor device and a manufacturing method thereof that can prevent mutual diffusion of impurity in a silicide layer and can decrease sheet resistance of an N-type polymetal gate electrode and a P-type polymetal gate electrode, respectively in the semiconductor device having gate electrodes of a polymetal gate structure and a dual gate structure.

The semiconductor device according to the present invention includes: a semiconductor substrate having an N-channel transistor forming region and a P-channel transistor forming region; first gate electrode provided on the N-channel transistor forming region of the semiconductor substrate; and second gate electrode provided on the P-channel transistor forming region of the semiconductor substrate, wherein the first gate electrode includes an N-type silicon layer containing N-type impurity, a first silicide layer formed on the N-type silicon layer, a first silicon film formed on the first silicide layer, a first metal nitride layer formed on the first silicon film, and a first metal layer formed on the first metal nitride layer, and the second gate electrode includes a P-type silicon layer containing P-type impurity, a second silicide layer formed on the P-type silicon layer and having a plurality of silicide grains which are discontinuously disposed in a direction substantially parallel with the surface of the semiconductor substrate, a second silicon film continuously formed on the surface of the P-type silicon layer exposed on the discontinuous part of the second silicide layer and on the surface of the second silicide layer, a second metal nitride layer formed on the second silicon film, and a second metal layer formed on the second metal nitride layer.

The semiconductor device manufacturing method according to the present invention includes: a first step of forming an N-type silicon layer containing N-type impurity on an N-channel transistor forming region of a semiconductor substrate, and forming a P-type silicon layer containing P-type impurity on a P-channel transistor forming region of the semiconductor substrate; a second step of forming a first silicide layer on the N-type silicon layer, and forming a second silicide layer by having a plurality of silicide grains disposed discontinuously in a direction substantially parallel with the surface of the semiconductor substrate on the P-type silicon layer; a third step of forming a continuous silicon film on the first silicide layer, on the surface of the P-type silicon layer exposed on the discontinuous part of the second silicide layer, and on the surface of the second silicide layer; a fourth step of forming a metal nitride layer on the silicon film; a fifth step of forming a metal layer on the metal nitride layer; and a sixth step of patterning the metal layer, the metal nitride layer, the silicon film, the first silicide layer, the second silicide layer, the N-type silicon layer, and the P-type silicon layer, thereby forming a first gate electrode including the N-type silicon layer in the N-channel transistor forming region, and forming a second gate electrode including the P-type silicon layer in the P-channel transistor forming region, respectively.

According to the present invention, the silicide layer is set discontinuous on the P-type silicon layer, thereby suppressing the increase in the resistance of the gate electrode due to mutual diffusion of impurity. At the same time, the surface of the silicide layer discontinuous from the surface of the P-type silicon layer exposed to the discontinuous part of the silicide layer is continuously covered with a silicon film. With this arrangement, the sheet resistance of the P-type polymetal gate electrode (the second gate electrode) can be decreased.

A non-doped silicon film is preferably used for the first and the second silicon films. With this arrangement, it becomes possible to further decrease the electric resistance of the P-type polymetal gate electrode. This is considered due to the following reason. When the metal nitride layer is in contact with the silicon layer containing much P-type impurity, the reaction between the metal nitride layer and the silicon layer is promoted due to the P-type impurity contained in the silicon layer. As a result, a thick metal silicide nitride layer is formed. On the other hand, the non-doped silicon film has small reaction with the metal nitride layer. Therefore, even when a metal silicide nitride film is formed, this film thickness can be decreased.

BRIEF DESCRIPTION OF THE DRAWINGS

The above and other objects, features and advantages of the present invention will become more apparent by reference to the following detailed description of the invention taken in conjunction with the accompanying drawings, wherein:

FIG. 8 is a cross section of one process (formation of a cap insulation film 109) of a method of manufacturing a semiconductor device according to a preferred embodiment of the present invention; a sixth step of patterning the metal layer, the metal nitride layer, the silicon film, the first silicide layer, the second silicide layer, the N-type silicon layer, and the P-type silicon layer, thereby forming a first gate electrode including the N-type silicon layer in the N-channel transistor forming region, and forming a second gate electrode including the P-type silicon layer in the P-channel transistor forming region, respectively;

DETAILED DESCRIPTION OF THE EMBODIMENTS

Preferred embodiments of the present invention will be explained below with reference to the accompanying drawings.

FIG. 1 to FIG. 10 are process diagrams schematically showing a process of manufacturing an N-channel transistor and a P-channel transistor having gate electrodes of polymetal gate and dual gate structures according to an embodiment of the present invention. In FIG. 1 to FIG. 10, a "region N" denotes a region in which an N-channel transistor including an N-type polymetal gate electrode is formed, and a "region P" denotes a region in which a P-channel transistor including a P-type polymetal gate electrode is formed.

Figure 1:
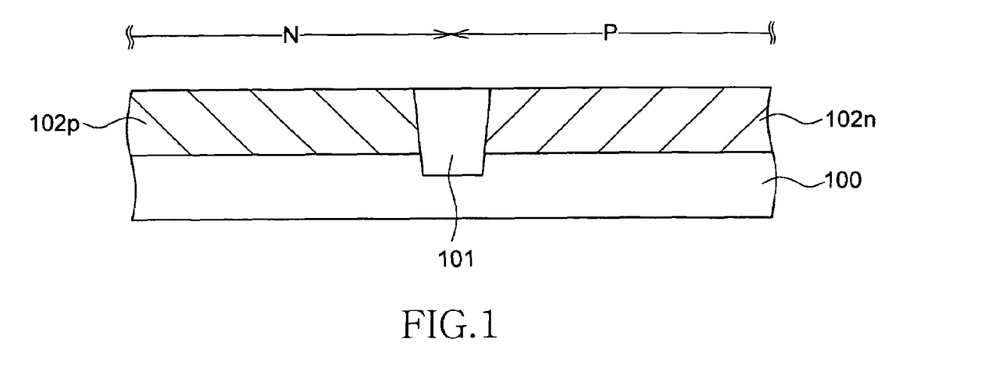
FIG. 1 is a cross section of one process (formation of an element isolation insulation film 101 to formation of a P well 102p and an N well 102n) of a method of manufacturing a semiconductor device according to a preferred embodiment of the present invention.

First, as shown in FIG. 1, an element isolation insulation film 101 is formed in a predetermined region of a semiconductor substrate 100, according to a shallow trench isolation (STI) technique, thereby isolating the region N from the region P. Next, boron (B) is doped as P-type impurity in the region N, thereby forming a P well 102p, and phosphorus (P) is doped as N-type impurity in the region P, thereby forming an N well 102n.

Figure 2:
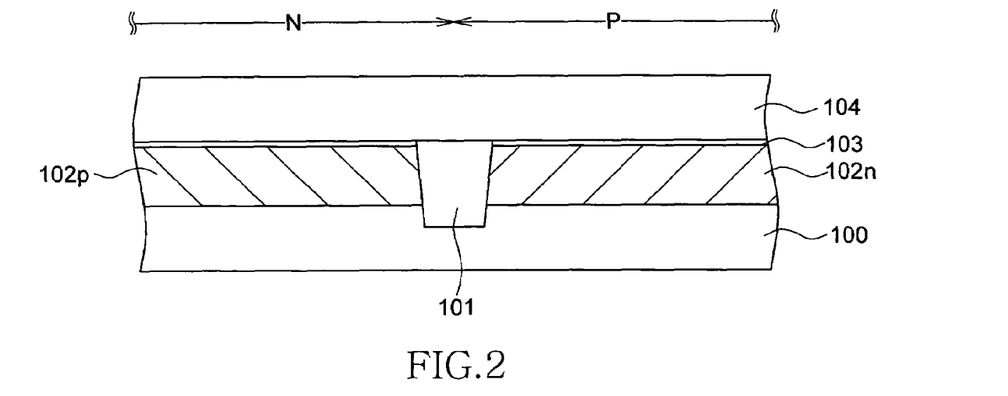
FIG. 2 is a cross section of one process (formation of a gate oxide film 103 to formation of a silicon layer 104) of a method of manufacturing a semiconductor device according to a preferred embodiment of the present invention.

Next, as shown in FIG. 2, the surface of the semiconductor substrate 100 is thermally oxidized, thereby forming a gate oxide film 103 having a film thickness of about 4 nm.

Next, a non-doped silicon layer 104 is formed in a thickness of about 100 nm on the gate oxide film 103, using a chemical vapor deposition (CVD) method. Either amorphous silicon or polycrystalline silicon can be used for the silicon layer 104. Preferably, amorphous silicon that can be formed on the surface without an uneven surface and is suitable for fine processing is used.

Figure 3:
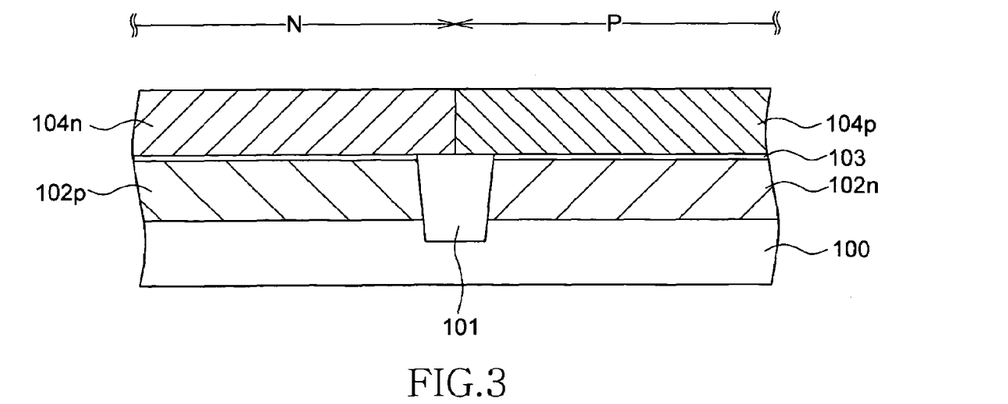
FIG. 3 is a cross section of one process (formation of an N-type silicon layer 104n and a P-type silicon layer 104p) of a method of manufacturing a semiconductor device according to a preferred embodiment of the present invention.

Next, as shown in FIG. 3, the region P is covered with a resist mask (not shown), and phosphorus (P) is ion-implanted as N-type impurity in the silicon layer 104 of the region N, in a dose of about $5\times10^{15}/\text{cm}^2$, using acceleration energy of about 10 keV, thereby changing the silicon layer 104 of the region N into an N-type silicon layer 104n. Next, the above resist mask that covers the region P is removed, and a resist mask (not shown) that covers the region N is formed. Boron (B) is ion-implanted as P-type impurity in the silicon layer 104 of the region P, in a dose of about $1\times10^{15}/\text{cm}^2$ to $5\times10^{15}/\text{cm}^2$, preferably about $3\times10^{15}/\text{cm}^2$ to $5\times10^{15}/\text{cm}^2$, using acceleration energy of about 5 keV, thereby changing the silicon layer 104 of the region P into a P-type silicon layer 104p.

Next, a native oxidation film formed on the surface of the silicon layer 104 (the N-type silicon layer 104n and the P-type silicon layer 104p) is removed, using a mixed solution of hydrofluoric acid (HF) and hydrogen peroxide solution ($H_2O_2$)

Figure 4:
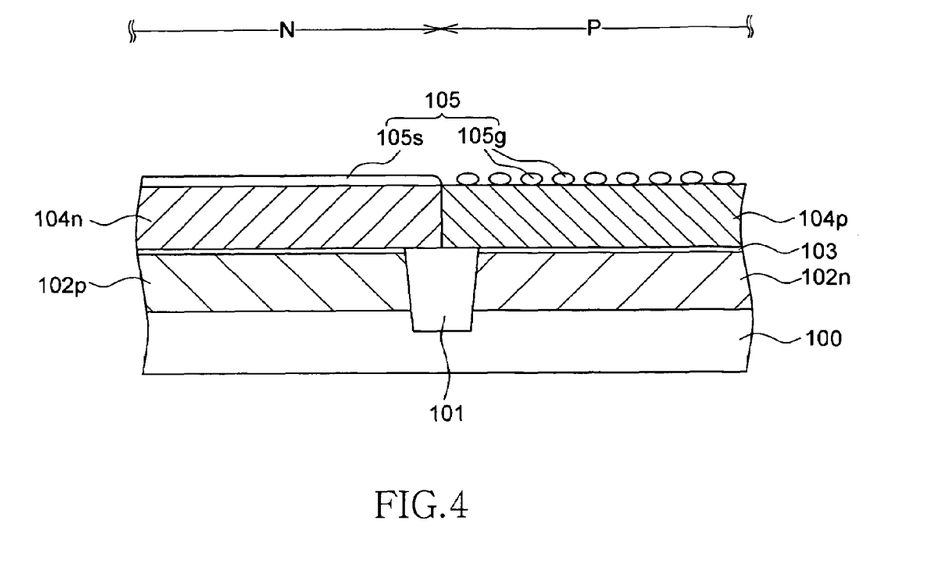
FIG. 4 is a cross section of one process (formation of a tungsten silicide layer 105) of a method of manufacturing a semiconductor device according to a preferred embodiment of the present invention.

Thereafter, a tungsten silicide ($WSi_2$) layer 105 is formed as a silicide layer on the silicon layer 104, as shown in FIG. 4. The $WSi_2$ layer 105 is formed on the N-type silicon layer 104n, as a $WSi_2$ layer 105s that covers the entire surface of the N-type silicon layer 104n. The $WSi_2$ layer 105 is formed on the P-type silicon layer 104p, such that plural granular $WSi_2$ grains 105g are disposed discontinuously in a direction substantially parallel with the surface of the semiconductor substrate. When the $WSi_2$ layer 105 is set discontinuous on the P-type silicon layer 104p, it is possible to suppress mutual diffusion of the P-type impurity contained in the P-type silicon layer 104p and the N-type impurity contained in the N-type silicon layer 104n, via the $WSi_2$ layer 105.

The $WSi_2$ layer 105 is formed by the CVD method as follows. Dichlorosilane ($SiH_2Cl_2$) having a flow rate of about 200 sccm and tungsten hexafluoride ($WF_6$) having a flow rate of about 2 sccm are supplied respectively, to a reaction chamber at a pressure of about 30 Pa to 100 Pa, by setting a temperature of the semiconductor substrate 100 to about 550° C. These materials are reacted for about 30 seconds to form the $WSi_2$ layer 105. As a result, the $WSi_2$ layer 105 is formed as a continuous film on the N-type silicon layer 104n, and is formed as a discontinuous film on the P-type silicon layer 104p, influenced by the P-type impurity in the P-type silicon layer 104p, as described above. At this time, the deposited film thickness of the $WSi_2$ layer 105s formed on the N-type silicon layer 104n is preferably about 3 nm to 10 nm, more preferably, about 5 nm to 7 nm.

A preferable grain size of the $WSi_2$ grains 105g is about 5 nm to 30 nm. When the grain size is smaller than 5 nm, the interface resistance of the P-type polymetal gate electrode becomes high, and when the grain size exceeds 30 nm, the effect of suppressing mutual diffusion of impurity decreases. Preferably, a distance between two adjacent grains of the plural $WSi_2$ grains 105g is about 2 nm to 80 nm. When the distance is smaller than 2 nm, the $WSi_2$ grains 105g are too closely adjacent to each other, and there is a risk of being unable to suppress mutual diffusion of impurity. When the distance exceeds 80 nm, the area in which $WSi_2$ grains are not formed becomes too large, and there is a risk that the interface resistance of the P-type polymetal gate electrode becomes high.

Figure 5:
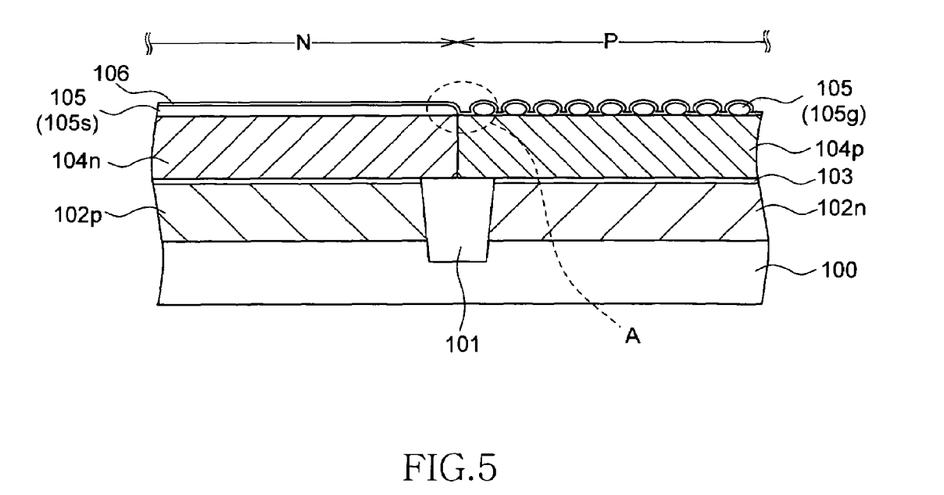
FIG. 5 is a cross section of one process (formation of a silicon film 106) of a method of manufacturing a semiconductor device according to a preferred embodiment of the present invention.

Next, as shown in FIG. 5, a continuous non-doped silicon film 106 is formed by the CVD method, on the surfaces of the $WSi_2$ layer 105s, the P-type silicon layer 104p exposed to discontinuous parts of the $WSi_2$ grains 105g, and the $WSi_2$ grains 105g. The continuous non-doped silicon film 106 is formed in the following condition. The $WF_6$ that has been supplied to the reaction chamber as gas for forming the $WSi_2$ layer 105 is stopped. The flow rate of dichlorosilane is set to about 300 sccm. Argon (Ar) is supplied at a flow rate of about 800 sccm. A temperature of the semiconductor substrate 100 is set to about 500° C., and the pressure of the reaction chamber is set to about 50 Pa to 300 Pa. The non-doped silicon film 106 is formed in this condition for about 5 seconds to 120 seconds, preferably for 40 seconds to 120 seconds.

When the silicon film 106 is too thin, it is not possible to sufficiently obtain the effect of suppressing the increase in resistance due to the discontinuous setting of the $WSi_2$ layer 105 on the P-type polymetal gate electrode. When the silicon film 106 is too thick, conductivity becomes low between the tungsten nitride (WN) layer and the tungsten (W) layer to be formed later and the $WSi_2$ layer 105 and the silicon layer 104. At the same time, there is a risk that the resistance of the N-type and the P-type polymetal gate electrodes becomes high. Therefore, preferably, the film thickness of the silicon film 106 is about 0.3 nm to 1.5 nm. The film thickness of the silicon film 106 can be suitably changed, by properly changing the pressure in the reaction chamber, the film formation (process) time, and the flow rate of dichlorosilane. The silicon film 106 can be formed using amorphous silicon or polysilicon.

Next, chlorine and fluorine gases that remain in the $WSi_2$ layer 105 due to the formation of the $WSi_2$ layer 105 by the CVD method are removed, as degas processing, by rapid thermal annealing (RTA) for about 30 seconds in the $N_2$ atmosphere at about 830° C. Based on this thermal annealing, the N-type impurity implanted in the N-type silicon layer 104n and the P-type impurity implanted in the P-type silicon layer 104p are activated at the same time. The amorphously formed silicon film 104 is converted into a polysilicon film at this time.

Figure 11:
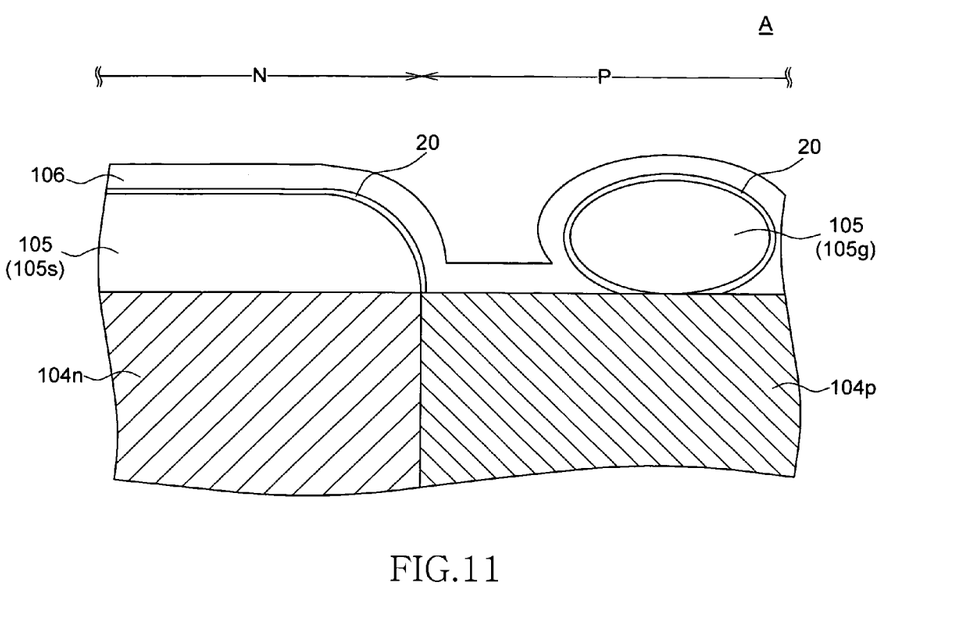
FIG. 11 is a cross section of one process (partiality enlarged illustration of part A shown in FIG. 5) of a method of manufacturing a semiconductor device according to a preferred embodiment of the present invention.

As shown in FIG. 11 which is as an enlarged view of a part A in FIG. 5, an interface part between the silicon film 106 and the $WSi_2$ layer 105 (105s, 105g) react by the thermal annealing for degassing, thereby forming a silicide layer 20, in some cases. However, even when the silicide layer 20 is formed, the film thickness thereof is very small, and the surface at the opposite side of the $WSi_2$ layer 105 of the silicon film 106 is not silicified.

Figure 6:
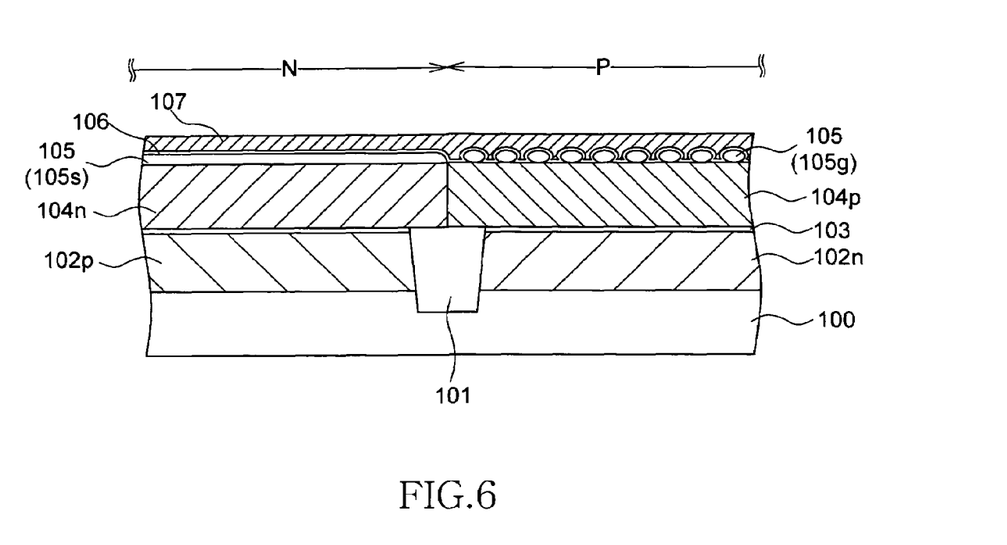
FIG. 6 is a cross section of one process (formation of a tungsten nitride layer 107) of a method of manufacturing a semiconductor device according to a preferred embodiment of the present invention.

Next, as shown in FIG. 6, a tungsten nitride (WN) layer 107 is formed by sputtering, in a thickness of about 10 nm, as a metal nitride layer, on the silicon film 106.

Figure 7:
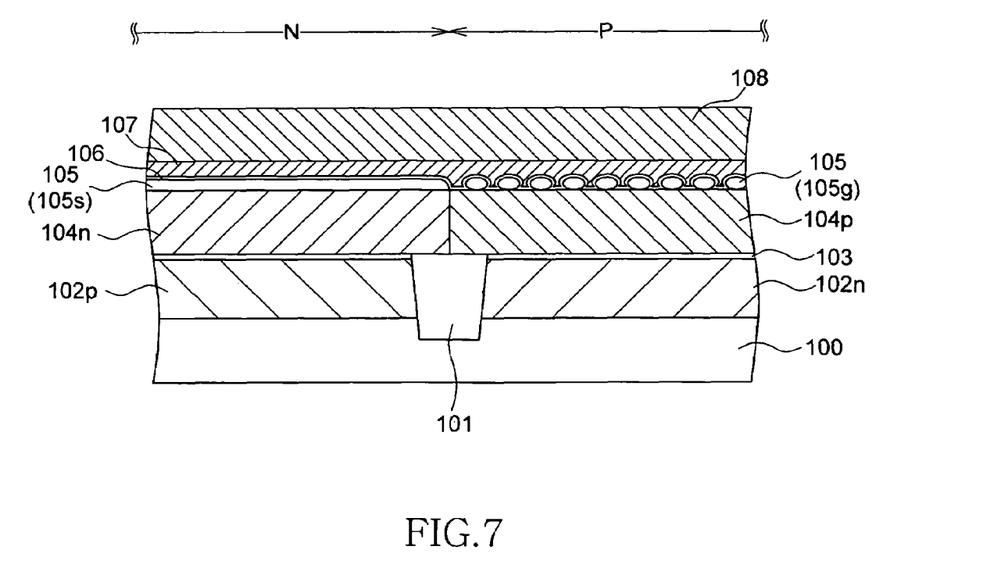
FIG. 7 is a cross section of one process (formation of a tungsten layer 108) of a method of manufacturing a semiconductor device according to a preferred embodiment of the present invention.

As shown in FIG. 7, a tungsten (W) layer 108 is formed by sputtering, in a thickness of about 80 nm, as a metal layer, on the WN layer 107.

Figure 8:
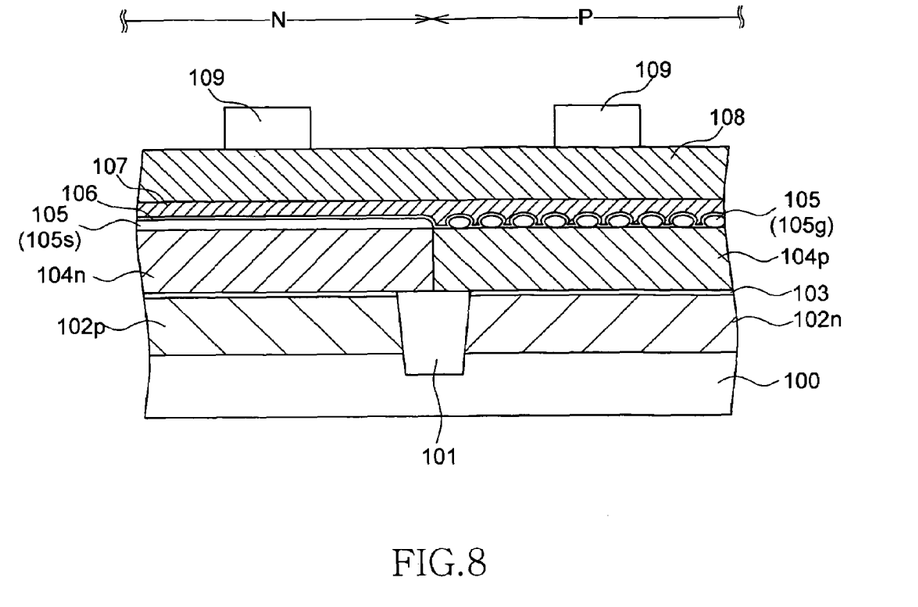

Next, as shown in FIG. 8, a silicon nitride film is formed in a thickness of about 200 nm, on the W layer 108, by the CVD method. The silicon nitride film is patterned in a gate electrode shape, thereby forming a cap insulation film 109.

Figure 9:
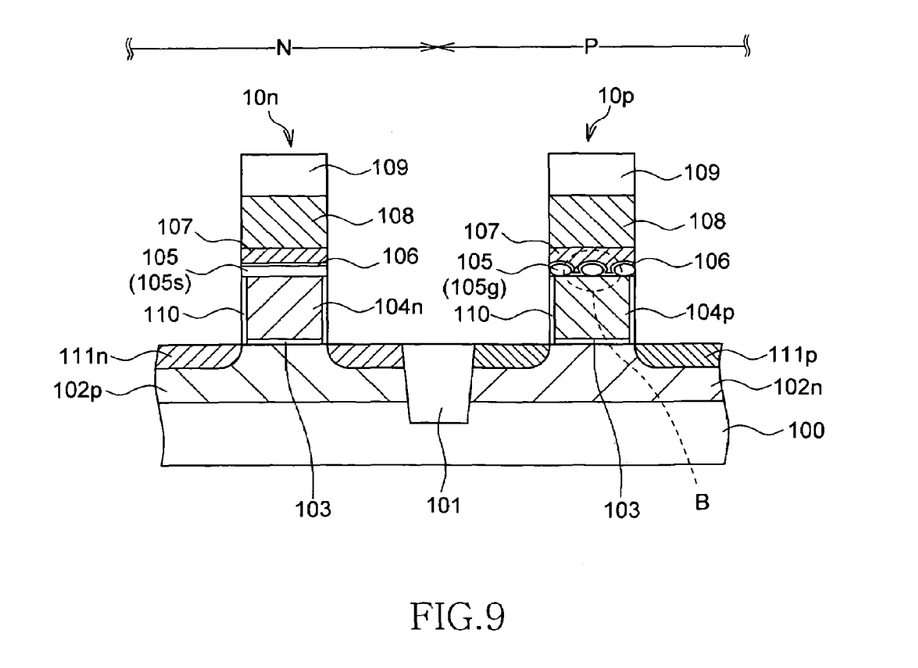
FIG. 9 is a cross section of one process (gate patterning to formation of an N-type source and drain diffusion layer 111n and a P-type source and drain diffusion layer 111p) of a method of manufacturing a semiconductor device according to a preferred embodiment of the present invention.

As shown in FIG. 9, a laminated film of the W layer 108, the WN layer 107, the silicon film 106, the $WSi_2$ layer 105 (105s, 105g), and the polysilicon layer 104 (104n, 104p) is patterned by dry etching, using the cap insulation film 109 as a mask, thereby forming an N-type polymetal gate electrode 10n containing the N-type polysilicon layer 104n in the region N, and forming a P-type polymetal gate electrode 10p containing the P-type polysilicon layer 104p in the region P.

The end part of each gate electrode is damaged by dry etching for the gate patterning. In order to recover this end part from the damage, a side surface oxidation film 110 is formed on the side surface of the polysilicon layer 104 of each gate electrode, by thermal annealing.

Figure 12:
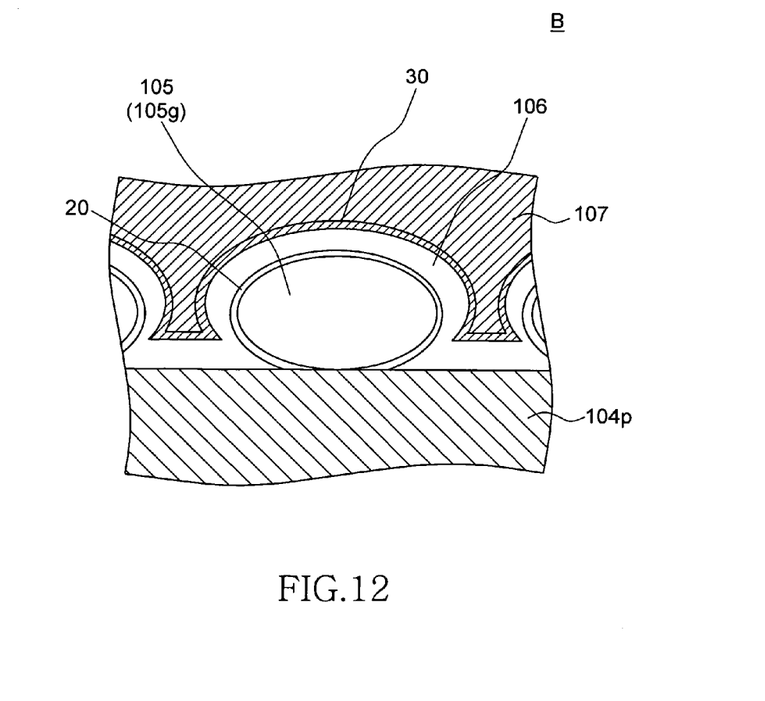
FIG. 12 is a cross section of one process (partiality enlarged illustration of part B shown in FIG. 8) of a method of manufacturing a semiconductor device according to a preferred embodiment of the present invention.

As shown in FIG. 12 which is an enlarged view of a part B in FIG. 9, the silicon film 106 reacts with the WN layer 107, due to the thermal annealing performed to form the side surface oxidation film 110, thereby forming a tungsten silicide nitride layer (WSiN layer) 30. However, according to the present embodiment, the WN layer 107 reacts with the non-doped silicon film 106 in contact with this film, not with the P-type silicon layer 104p containing impurity in high concentration. Therefore, the formed WSiN layer 30 has a very small film thickness. Consequently, it is possible to suppress the increase in electric resistance of the P-type polymetal gate electrode 10p.

When the thermal annealing is performed in a state that the WN layer 107 is in contact with the silicon layer 104p containing a large amount of P-type impurity according to the conventional technique, the reaction between the WN layer 107 and the silicon layer 104p is promoted by the impurity contained in the silicon layer 104p. As a result, a thick WSiN layer is easily formed by this method. On the other hand, according to the present embodiment, when the WN layer 107 is in contact with the non-doped silicon film 106, a reaction between the WN layer 107 and the non-doped silicon film 106 does not progress even when the thermal annealing is performed.

Next, the region P is covered with a resist mask (not shown), and N-type impurity (such as arsenic (As)) is ion-implanted in high concentration into the region N, thereby forming an N-type source and drain diffusion layer 111a as shown in FIG. 9. The resist mask that covers the region P is removed, and a resist mask (not shown) is formed to cover the region N. P-type impurity (such as boron (B)) is ion-implanted in high concentration into the region P, thereby forming a P-type source and drain diffusion layer 111p.

Figure 10:
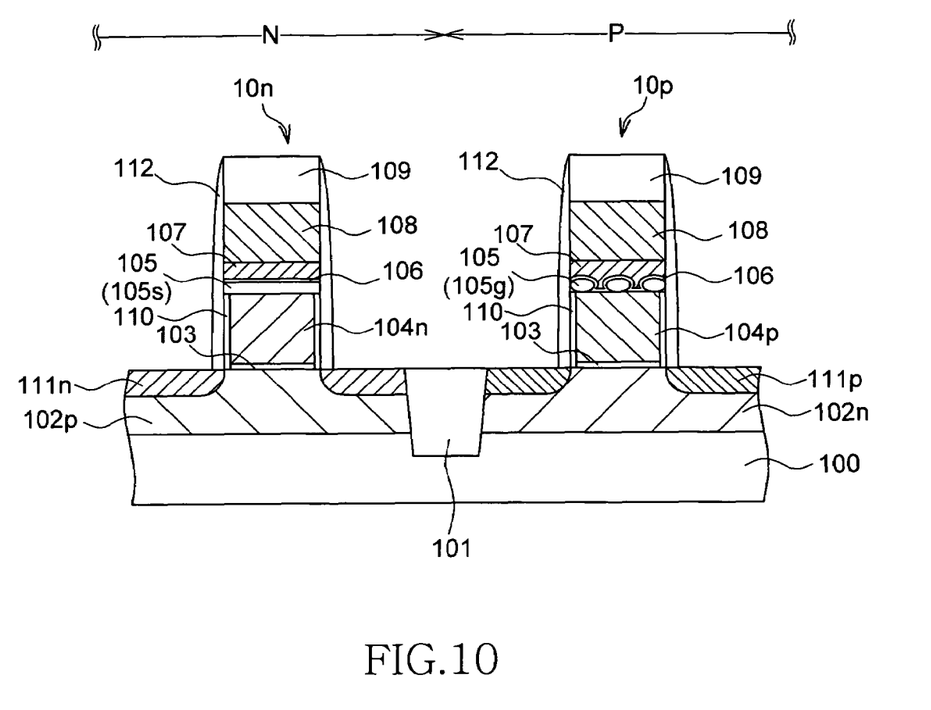
FIG. 10 is a cross section of one process (partiality enlarged illustration of part A shown in FIG. 5) of a method of manufacturing a semiconductor device according to a preferred embodiment of the present invention.

A silicon nitride film is formed in a thickness of about 40 nm on the entire surface, and the silicon nitride film is etched back, thereby forming sidewall insulation films 112 on side surfaces of the N-type polymetal gate electrode 10n and the P-type polymetal gate electrode 10p, respectively, as shown in FIG. 10.

In the above process, the N-channel transistor having the N-type polymetal gate electrode 10n is completed in the region N, and the P-channel transistor having the P-type polymetal gate electrode 10p is completed in the region P.

Figure 13:
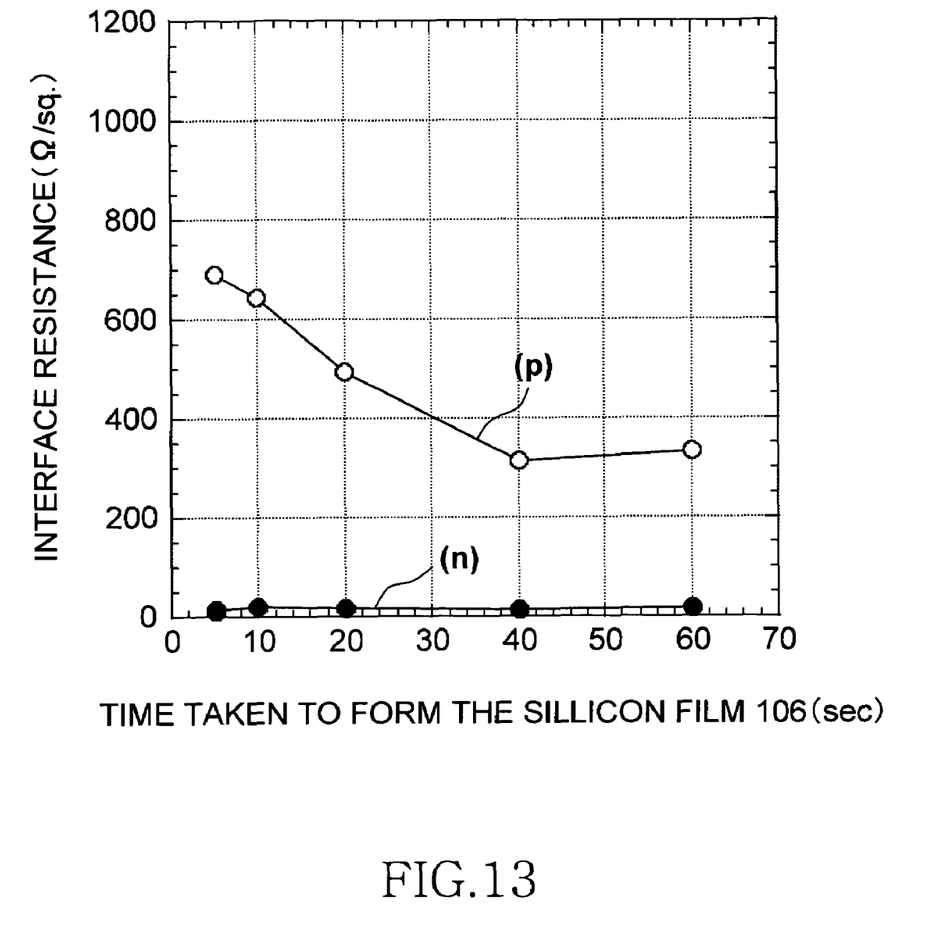
FIG. 13 is a relationship between the time taken to form the silicon film 106 and the interface resistance of a method of manufacturing a semiconductor device according to a preferred embodiment of the present invention.

FIG. 13 shows a relationship between the time taken to form the silicon film 106 by CVD and the interface resistance (contact resistance of the N-type polysilicon layer 104n and the WSi$_2$ layer 105 (105s)) of the N-type polymetal gate electrode 10n and the interface resistance (contact resistance of the P-type polysilicon layer 104p and the WSi$_2$ layer 105 (105g)) of the P-type polymetal gate electrode 10p.

In FIG. 13, (p) represents the interface resistance between the P-type silicon layer 104p and the WSi$_2$ layer 105 (105g), and (n) represents the interface resistance between the N-type silicon layer 104n and the WSi$_2$ layer 105 (105s).

In the N-type polymetal gate electrode 10n, the WSi$_2$ layer 105 is formed on the entire surface of the N-type silicon layer 104n. Therefore, the interface resistance (n) is low and is substantially constant, regardless of the film formation time of the silicon film 106. On the other hand, in the P-type polymetal gate electrode 10p, the interface resistance (p) can be decreased along the increase in the film formation time of the silicon film 106. Specifically, the interface resistance gradually decreases along the increase in the film formation time, and becomes substantially saturated when the film formation time exceeds 40 seconds.

Figure 14:
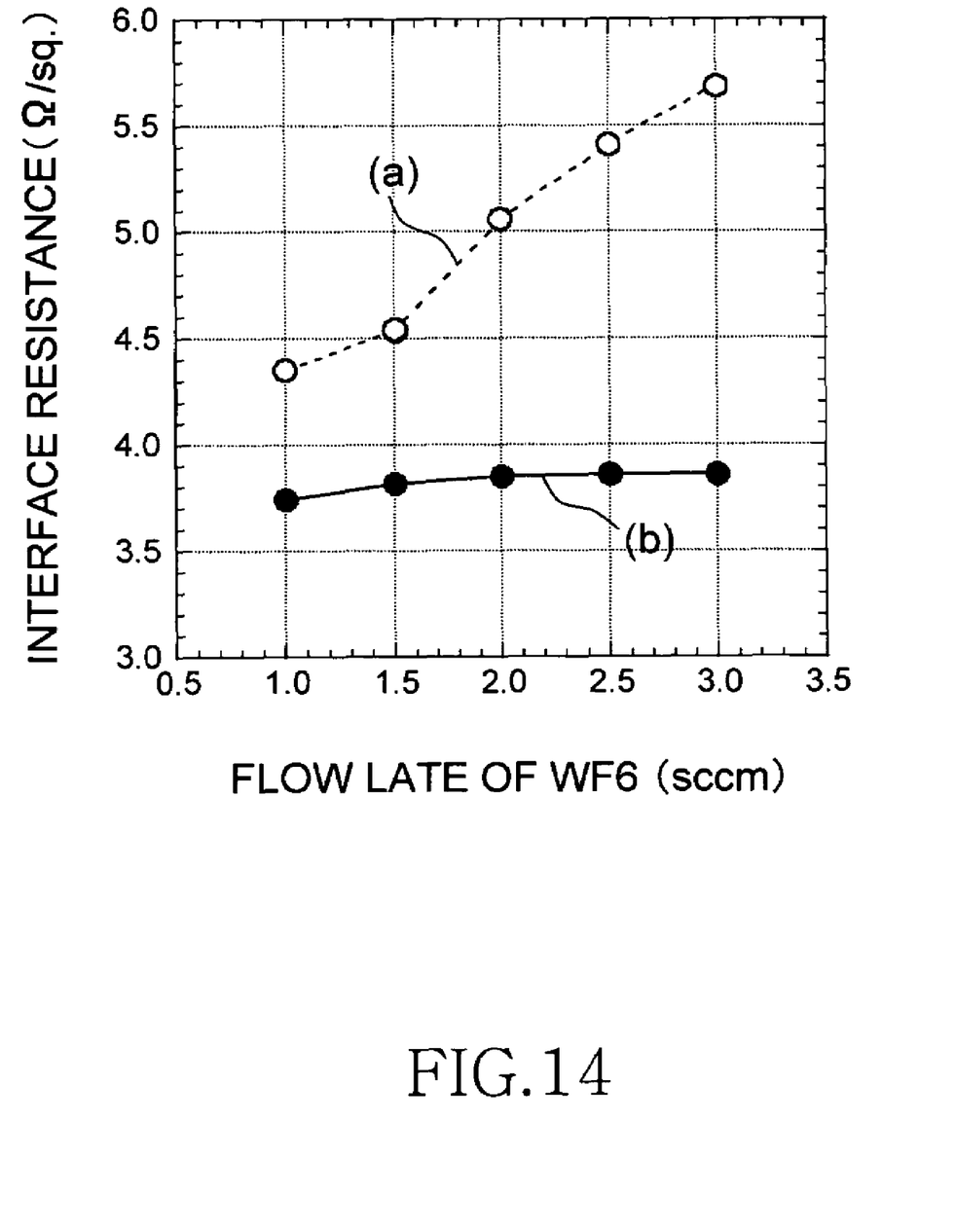
FIG. 14 is a relationship between the flow rate of $WF_6$ and the sheet resistance of a method of manufacturing a semiconductor device according to a preferred embodiment of the present invention.

FIG. 14 shows a relationship between the flow rate of WF$_6$ at the time of forming the WSi$_2$ layer 105 by CVD and the sheet resistance of the WSi$_2$ layer 105 in the P-type polymetal gate electrode 10p.

In FIG. 14, (a) denotes sheet resistance when the silicon film 106 is not formed on the WSi$_2$ layer 105 according to the conventional technique, and (b) denotes sheet resistance when the silicon film 106 is formed on the WSi$_2$ layer 105 according to the present embodiment. Discontinuity of the WSi$_2$ layer 105 becomes high when the flow rate of WF$_6$ becomes high. Therefore, the sheet resistance (a) when the silicon film 106 is not formed on the WSi$_2$ layer 105 becomes high along the increase in the flow rate of WF$_6$. On the other hand, the sheet resistance (b) when the silicon film 106 is formed on the WSi$_2$ layer 105 can be low, even when the flow rate of WF$_6$ becomes high, that is, even when discontinuity of the WSi$_2$ layer 105 becomes high.

As explained above, according to the present embodiment, when the WSi$_2$ layer 105 is set discontinuous on the P-type silicon layer 104p, the increase in the resistance of the gate electrode due to mutual diffusion of impurity can be suppressed. At the same time, when the surface of the WSi$_2$ layer 105 (the WSi$_2$ grains 105g) discontinuous from the surface of the P-type silicon layer 104p exposed to the discontinuous part of the WSi$_2$ layer 105 is continuously covered with the silicon film 106, the resistance of the P-type polymetal gate electrode 10p can be decreased.

While preferred embodiments of the present invention have been described hereinbefore, the present invention is not limited to the aforementioned embodiments and various modifications can be made without departing from the spirit of the present invention. It goes without saying that such modifications are included in the scope of the present invention.

In the above embodiment, tungsten (W) is used for the metal layer, a tungsten nitride (WN) layer is used for the metal nitride layer, and a tungsten silicide (WSi$_2$) layer is used for the silicide layer, as an example. In place of the above, it is also possible to use other refractory metal such as cobalt (Co), titanium (Ti), nickel (Ni), and tantalum (Ta), and a nitride layer and a silicide layer of these materials.

The silicon film 106 is not limited to those non-doped, and can contain impurity in low concentration, so long as the WSiN layer 30 (a metal silicide nitride layer) shown in FIG. 12 is formed thick, and the interface resistance of the P-type polymetal gate electrode does not increase.

The thermal annealing of the WSi$_2$ layer for degassing can be performed before the formation of the silicon film 106.

In the above embodiment, following the formation of the WSi$_2$ layer 105, the silicon film 106 is formed by using dichlorosilane that is used to form the WSi$_2$ layer 105, in the same CVD device, as an example. Alternatively, after the formation of the WSi$_2$ layer 105, the semiconductor substrate can be shifted to a different CVD device, and the silicon film 106 can be formed by a CVD method using monosilane (SiH$_4$).

What is claimed is:

1. A semiconductor device comprising:
a semiconductor substrate having an N-channel transistor forming region and a P-channel transistor forming region;
a first gate electrode provided on the N-channel transistor forming region of the semiconductor substrate; and
a second gate electrode provided on the P-channel transistor forming region of the semiconductor substrate, wherein
the first gate electrode includes an N-type silicon layer containing N-type impurity, a first silicide layer formed on the N-type silicon layer, a first silicon film formed on the first silicide layer, a first metal nitride layer formed on the first silicon film, and a first metal layer formed on the first metal nitride layer, and the second gate electrode includes a P-type silicon layer containing P-type impurity, a second silicide layer formed on the P-type silicon layer and having a plurality of silicide grains which are discontinuously disposed in a direction substantially parallel with the surface of the semiconductor substrate, a second silicon film continuously formed on the surface of the P-type silicon layer exposed on the discontinuous part of the second silicide layer and on the surface of the second silicide layer, a second metal nitride layer formed on the second silicon film, and a second metal layer formed on the second metal nitride layer.

2. The semiconductor device as claimed in claim 1, wherein the first and the second silicon films are non-doped.

3. The semiconductor device as claimed in claim 1, wherein the silicide layer, the metal nitride layer, and the metal layer contain the same refractory metal.

4. The semiconductor device as claimed in claim 2, wherein the silicide layer, the metal nitride layer, and the metal layer contain the same refractory metal.

5. The semiconductor device as claimed in claim 3, wherein the refractory metal is any one of tungsten (W), cobalt (Co), titanium (Ti), nickel (Ni), and tantalum (Ta).

6. The semiconductor device as claimed in claim 4, wherein the refractory metal is any one of tungsten (W), cobalt (Co), titanium (Ti), nickel (Ni), and tantalum (Ta).

7. The semiconductor device as claimed in claim 1, wherein the P-type impurity is boron (B).

8. The semiconductor device as claimed in claim 2, wherein the P-type impurity is boron (B).

9. The semiconductor device as claimed in claim 3, wherein the P-type impurity is boron (B).

10. The semiconductor device as claimed in claim 4, wherein the P-type impurity is boron (B).

11. The semiconductor device as claimed in claim 5, wherein the P-type impurity is boron (B).

12. The semiconductor device as claimed in claim 6, wherein the P-type impurity is boron (B).

* * * * *